US008807271B2

(12) United States Patent
Chen et al.

(10) Patent No.: US 8,807,271 B2
(45) Date of Patent: Aug. 19, 2014

(54) SPEAKER DEVICE WITH VIBRATION ABSORBING FUNCTION AND AUDIO DISPLAY DEVICE THEREWITH

(71) Applicant: Wistron Corporation, New Taipei (TW)

(72) Inventors: Chih-Hsin Chen, New Taipei (TW); Chang-Ming Kuo, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 0 days.

(21) Appl. No.: 13/888,396

(22) Filed: May 7, 2013

(65) Prior Publication Data

US 2014/0014434 A1 Jan. 16, 2014

(30) Foreign Application Priority Data

Jul. 12, 2012 (TW) ............................. 101213462 A

(51) Int. Cl.

| | |
|---|---|
| ***F16F 15/04*** | (2006.01) |
| ***H05K 7/14*** | (2006.01) |
| ***G10K 11/00*** | (2006.01) |
| ***G10K 11/16*** | (2006.01) |
| *F16F 15/02* | (2006.01) |
| *F16F 15/06* | (2006.01) |
| *H05K 7/00* | (2006.01) |
| *H04R 1/02* | (2006.01) |

(52) U.S. Cl.

CPC ................ *G10K 11/002* (2013.01); *H04R 1/02* (2013.01); *G10K 11/004* (2013.01); *G10K 11/16* (2013.01)

USPC ........... 181/199; 181/209; 381/333; 381/388; 381/392; 381/395; 361/679.34; 361/679.35

(58) Field of Classification Search

USPC .......... 181/199, 207, 209, 148, 150; 381/333, 381/332, 388, 389, 392, 395, 386, 353, 354, 381/87; 361/679.34, 679.35, 679.36

See application file for complete search history.

(56) References Cited

U.S. PATENT DOCUMENTS

| | | | | |
|---|---|---|---|---|
| 2,912,212 | A * | 11/1959 | Lowe et al. | 248/573 |
| 3,814,357 | A * | 6/1974 | Rontgen | 248/573 |
| 4,538,697 | A * | 9/1985 | Muroi et al. | 180/68.4 |
| 4,722,505 | A * | 2/1988 | Kaiser | 248/561 |
| 5,414,229 | A * | 5/1995 | Rocheleau et al. | 181/150 |
| 5,956,314 | A * | 9/1999 | Ishimatsu et al. | 720/693 |
| 5,956,412 | A * | 9/1999 | Park | 381/386 |

(Continued)

FOREIGN PATENT DOCUMENTS

TW 253552 8/1995

*Primary Examiner* — Edgardo San Martin

(74) *Attorney, Agent, or Firm* — Winston Hsu; Scott Margo

(57) ABSTRACT

A speaker device with vibration absorbing function includes a main body and at least one damping mechanism. The main body is installed inside a first casing and a second casing for generating sound. The at least one damping mechanism is connected to the main body and includes a sheathing member, a sleeve member and a resilient member. The sheathing member is disposed on the first casing and located in a position near the main body. The sleeve member is connected to the main body and sheathes the sheathing member in a slidable manner for transmitting vibration generated by the main body as generating sound. Two ends of the resilient member are respectively installed inside the sheathing member and inside the sleeve member for resiliently abutting against the sleeve member, so as to absorb the vibration transmitted from the sleeve member as the main body generates sound.

17 Claims, 7 Drawing Sheets

(56) References Cited

U.S. PATENT DOCUMENTS 6,252,768 B1 * 6/2001 Lin .......................... 361/679.34
6,307,748 B1 * 10/2001 Lin et al. ........................ 361/704
6,648,295 B2 * 11/2003 Herren et al. ................. 248/636
6,990,212 B2 * 1/2006 Kambe ......................... 381/386
7,239,715 B2 * 7/2007 Maekawa et al. ............ 381/389
7,701,699 B2 * 4/2010 Ma ........................... 361/679.21
7,965,496 B2 * 6/2011 Li et al. .................... 361/679.01
8,139,783 B2 * 3/2012 Schuster et al. ................ 381/86
8,480,052 B2 * 7/2013 Taylor et al. .................. 248/638
8,577,070 B2 * 11/2013 Yu ................................. 381/353
8,660,291 B2 * 2/2014 Wang ............................ 381/392
2006/0061954 A1 * 3/2006 Lam .............................. 361/685
2013/0206499 A1 * 8/2013 Maruyama et al. ........... 181/207

* cited by examiner

SPEAKER DEVICE WITH VIBRATION ABSORBING FUNCTION AND AUDIO DISPLAY DEVICE THEREWITH

BACKGROUND OF THE DISCLOSURE

1. Field of the Disclosure

The present disclosure relates to a speaker device and an audio display device therewith, and more particularly, to a speaker device with vibration absorbing function and an audio display device therewith.

2. Description of the Prior Art

Generally speaking, a notebook computer is equipped with a speaker device for generating sound, so as to enhance visual sense of the notebook computer in use, such as video display, computer game playing and so on. A conventional speaker device includes a vibration absorbing structure disposed on a periphery thereof and made of rubber materials or sponge materials. The vibration absorbing structure is for absorbing vibration generated by the speaker device as generating the sound, so as to reduce noise resulting from the vibration as the speaker device is generating the sound.

When the speaker device and a lower casing of the notebook computer is assembled, a conventional way is to screw the speaker device and the lower casing, so as to fix the speaker device on the lower casing. However, it requires not only additional screwing operation in manufacture, resulting in increase of labor time, but also additional screwing components, such as screws and so on, to screw the speaker device and the lower casing, resulting in increase of costs. As a result, the conventional speaker does not facilitate manufacture.

In addition, the conventional vibration absorbing materials, such as rubber materials, sponge materials and so on, have higher cost, and thus it disadvantages to decrease the costs in manufacture more. Moreover, the aforesaid rubber materials or sponge materials easily deteriorate due to environmental effect, such as organic pollutants, oxidization and so on, so as to affect vibration absorbing effect. Accordingly, it reduces product quality of the speaker device resulting from incapability of noise decrease.

SUMMARY OF THE DISCLOSURE

Thus, the present disclosure provides a speaker device with vibration absorbing function and an audio display device therewith for solving above drawbacks.

According to the disclosure, a speaker device is adapted to an audio display device. The audio display device includes a first casing and a second casing. The speaker device includes a main body and at least one damping mechanism. The main body is installed inside the first casing and the second casing for generating sound. The at least one damping mechanism is connected to the main body, and the at least one damping mechanism includes a sheathing member, a sleeve member and a resilient member. The sheathing member is disposed on the first casing and located in a position near the main body. The sleeve member is connected to the main body and sheathing the sheathing member in a slidable manner, and the sleeve member is for transmitting vibration generated by the main body as generating sound. Two ends of the resilient member are respectively installed inside the sheathing member and inside the sleeve member, and the resilient member is for resiliently abutting against the sleeve member, so as to absorb the vibration transmitted from the sleeve member as the main body generates the sound.

According to the disclosure, the at least one damping mechanism further includes a resilient arm resiliently connected to the sleeve member and the main body. The resilient arm is for transmitting the vibration generated by the main body to the sleeve member.

According to the disclosure, the sleeve member includes a sheathing portion for sheathing the end of the resilient member, and the sheathing portion is further for slidably sheathing an outer surface of the sheathing member, such that the sleeve member slides relative to the sheathing member in a first direction or in a second direction opposite to the first direction.

According to the disclosure, the sheathing member includes a first stopping structure, and the sleeve member includes a second stopping structure. The first stopping structure is for stopping the second stopping structure, so as to prevent the sleeve member from separating from the sheathing member in the second direction.

According to the disclosure, the first stopping structure is a slot structure, and the second stopping structure is a hook structure slidably disposed inside the slot structure. The hook structure is for hooking a lateral wall of the slot structure when the sleeve member slides to a hooking position relative to the sheathing member in the second direction, so as to prevent the sleeve member from separating from the sheathing member.

According to the disclosure, a containing portion is formed on the sheathing member, and the containing portion is a sunken slot for containing the other end of the resilient member.

According to the disclosure, the speaker device further includes a fixing structure connected to a side of the main body. The fixing structure is for fixing the side of the main body on the first casing.

According to the disclosure, the speaker device further includes an elastic arm resiliently connected to the fixing structure and the side of the main body. The resilient arm is for transmitting the vibration generated by the main body.

According to the disclosure, the first casing includes a first clamping structure, and the second casing includes a second clamping structure. The second clamping structure presses the fixing structure onto the first clamping structure when the second casing is installed on the first casing, so as to fix the side of the main body on the first casing.

According to the disclosure, the first casing includes a screw post structure, and a through hole is formed on the fixing structure. The speaker device further includes a screw component for being disposed through the through hole and screwed with the screw post structure, so as to press the fixing structure onto the screw post structure.

According to the disclosure, the resilient member is a spring.

According to the claimed disclosure, an audio display device includes a first casing, a second casing and a speaker device. The second casing is installed on the first casing, and the speaker device includes a main body and at least one damping mechanism. The main body is installed inside the first casing and the second casing for generating sound. The at least one damping mechanism is connected to the main body, and the at least one damping mechanism includes a sheathing member, a sleeve member and a resilient member. The sheathing member is disposed on the first casing and located in a position near the main body. The sleeve member is connected to the main body and sheathing the sheathing member in a slidable manner, and the sleeve member is for transmitting vibration generated by the main body as generating sound. Two ends of the resilient member are respectively installed inside the sheathing member and inside the sleeve member, and the resilient member is for resiliently abutting against the sleeve member, so as to absorb the vibration transmitted from the sleeve member as the main body generates the sound.

In summary, the speaker device of the present disclosure utilizes the damping mechanism for absorbing vibration. When the main body generates the sound, the resilient member damps the vibration generated from the sound by flexibility thereof, so as to reduce the vibration generated from the sound to rebound back to the main body. In such a manner, the damping mechanism of the present disclosure can reduce noise resulting from the sound generated from the main body.

In practical application, the resilient member, such as a spring, advantages in low costs, and thus it can facilitate to decrease the costs in manufacture. In addition, the spring does not easily deteriorate due to environmental effect, such as organic pollutants, oxidization and so on, so as to preserve its elasticity. In other words, the spring has a better tolerance to make the vibration absorbing structure preserve better vibration absorbing effect, such that the speaker device can reduce noise more effectively and thus enhance product quality.

In addition, the speaker device of the present disclosure utilize the first stopping structure and the second stopping structure to prevent the sleeve member from separating from the sheathing member, so as to fix the speaker device on the first casing. During assembly, the sleeve member sheathes the sheathing member until the second stopping structure, i.e. the hook structure, is slidably disposed inside the first stopping structure, i.e. the slot structure. Accordingly, the present disclosure does not require additional screwing operation, resulting in saving labor hours and screwing components, such as screws. As a result, the speaker device of the present disclosure can further reduce the costs in manufacture.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
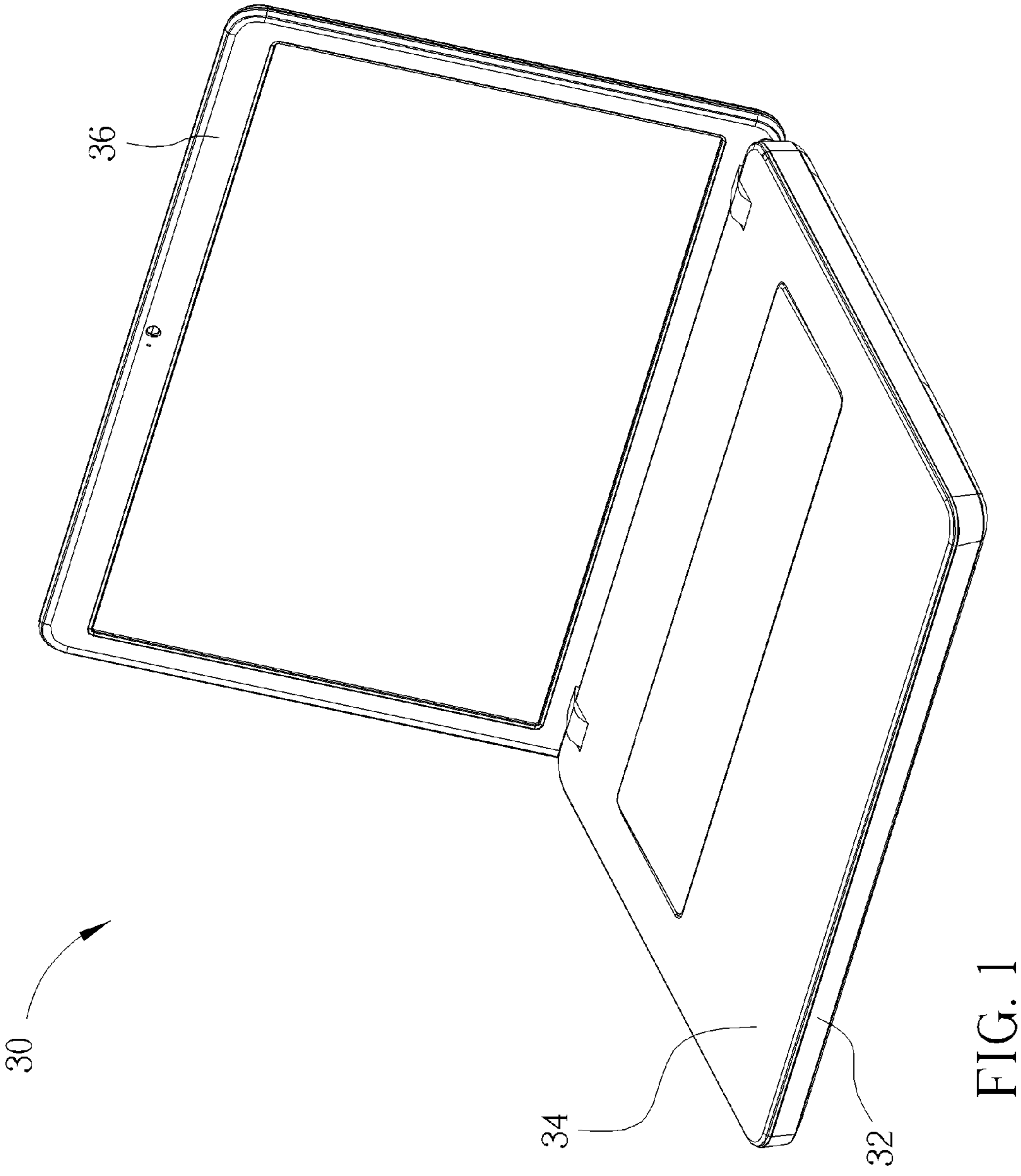
FIG. 1 is a schematic diagram of an audio display device according to an embodiment of the present disclosure.
Figure 2:
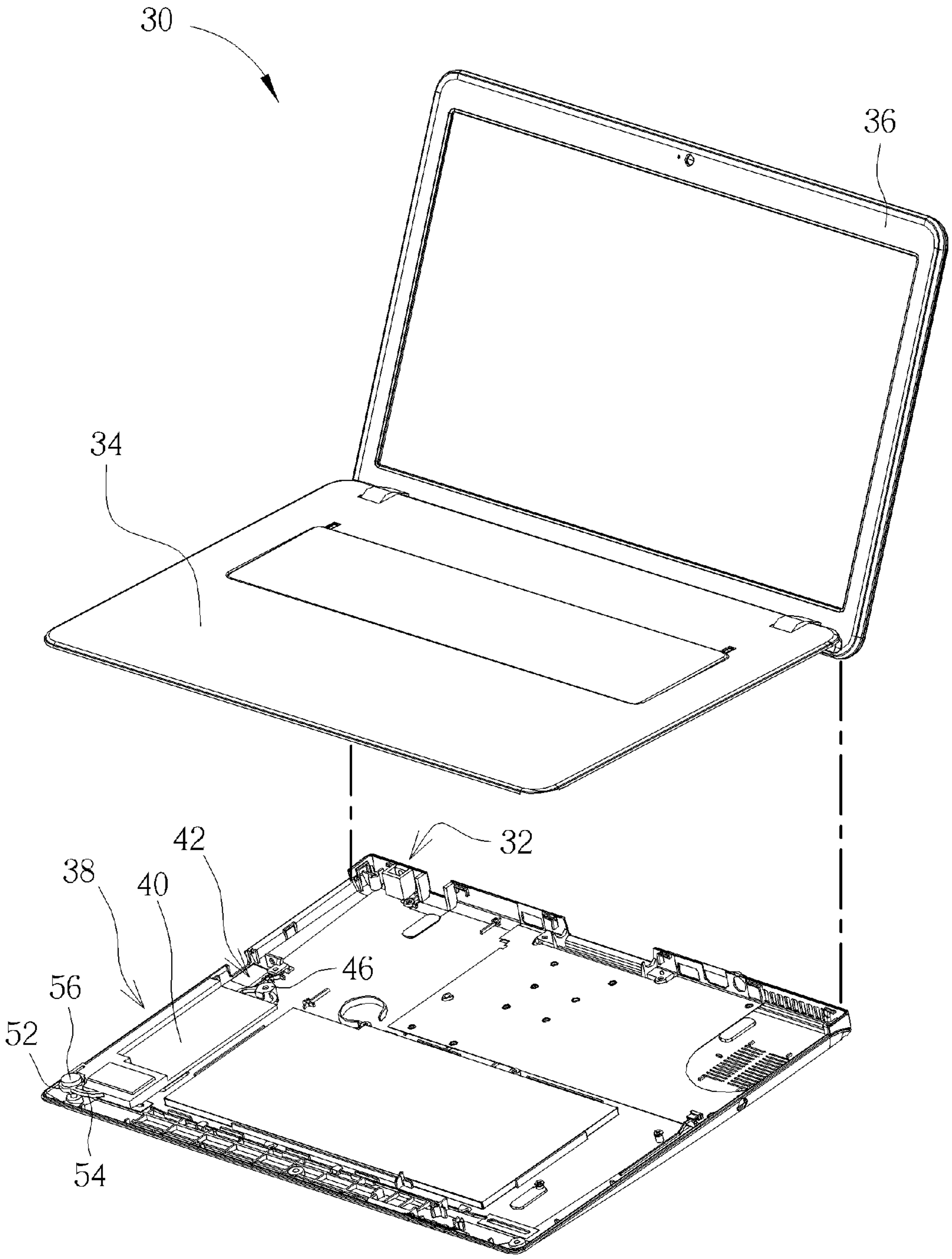
FIG. 2 is an exploded diagram of the audio display device according to the embodiment of the present disclosure.

Please refer to FIG. 1 and FIG. 2. FIG. 1 is a schematic diagram of an audio display device 30 according to an embodiment of the present disclosure. FIG. 2 is an exploded diagram of the audio display device 30 according to the embodiment of the present disclosure. As shown in FIG. 1 and FIG. 2, the audio display device 30 includes a first casing 32, a second casing 34 and a display module 36. The second casing 34 is installed on the first casing 32, and the second casing 34 and the first casing 32 are cooperatively used for covering internal components of the audio display device 30. The display module 36 is pivoted to the first casing 32 and/or the second casing 34, such that the display module 36 can pivot relative to the first casing 32 and the second casing 34. When the audio display device 30 is in use, the display module 36 is pivoted to be expanded on the second casing 34 for operating the audio display device 30. When the audio display device 30 is not in use, the display module 36 is pivoted to be contained on the second casing 34 for facilitating to carry or contain the audio display device 30.

Additionally, the audio display device 30 further includes a speaker device 38 installed inside the first casing 32 and the second casing 34. In this embodiment, the audio display device 30 is a notebook computer. The first casing 32 and the second casing 34 are respectively an upper casing and a lower casing of a host module of the notebook computer and for covering internal components such as a main board, an optical disk drive, a hard disk drive and so on. The display module 36 is a panel module of the notebook computer. The speaker device 38 is an audio module of the notebook computer. Implementations of the speaker device 38 are not limited to those mentioned in this embodiment. For example, the speaker device 38 can be an audio module of a desktop computer, an audio module of a tablet computer or an audio module of a DVD player. In other words, the audio display devices with audio modules are within the scope of the present disclosure. An amount and disposal positions of the speaker device 38 are not limited to those illustrated in figures, and it depends on practical demands.

Figure 3:
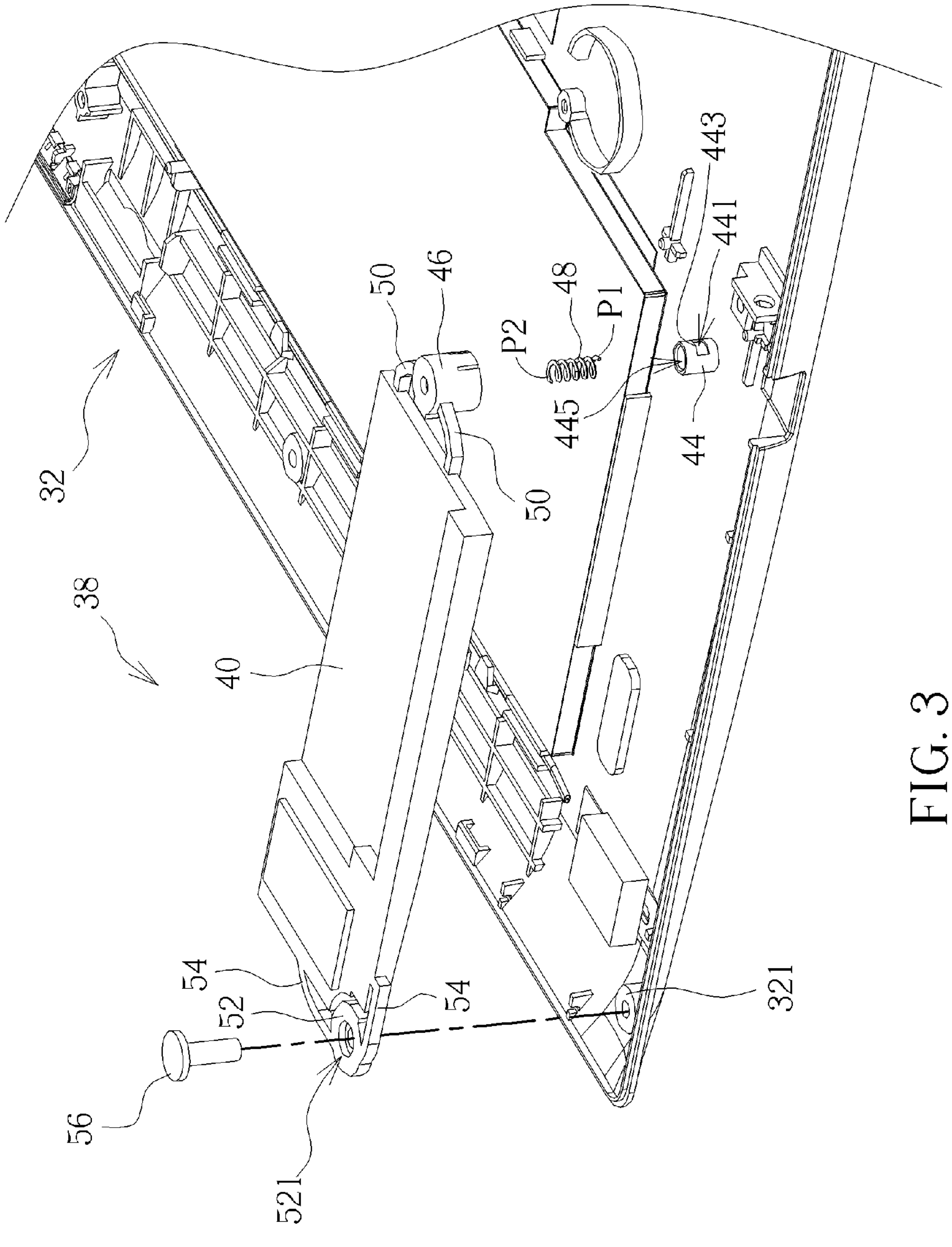
FIG. 3 is a partly exploded diagram of a first casing and a speaker device according to the embodiment of the present disclosure.

Please refer to FIG. 2 and FIG. 3. FIG. 3 is a partly exploded diagram of the first casing 32 and the speaker device 38 according to the embodiment of the present disclosure. As shown in FIG. 2 and FIG. 3, the speaker device 38 includes a main body 40 and a damping mechanism 42. The main body 40 is installed inside the first casing 32 and the second casing 34. Furthermore, the main body 40 is used for generating sound, so as to enhance visual sense of the audio display device 30 in use. The damping mechanism 42 is connected to the main body 40, and the damping mechanism 42 is used for damping vibration resulting from the sound generated by the main body 40, so as to make the speaker device 38 have a better audio quality. In this embodiment, the speaker device 38 includes one damping mechanism 42 connected to a side of the main body 40, as shown in FIG. 2. An amount and disposal positions of the speaker device 38 are not limited to those mentioned in this embodiment. For example, the speaker device 38 can include two damping mechanisms 42 connected to opposite sides of the main body 40. In other words, structures of the speaker device 38 with more than one damping mechanism 42 are within the scope of the present disclosure.

Figure 4:
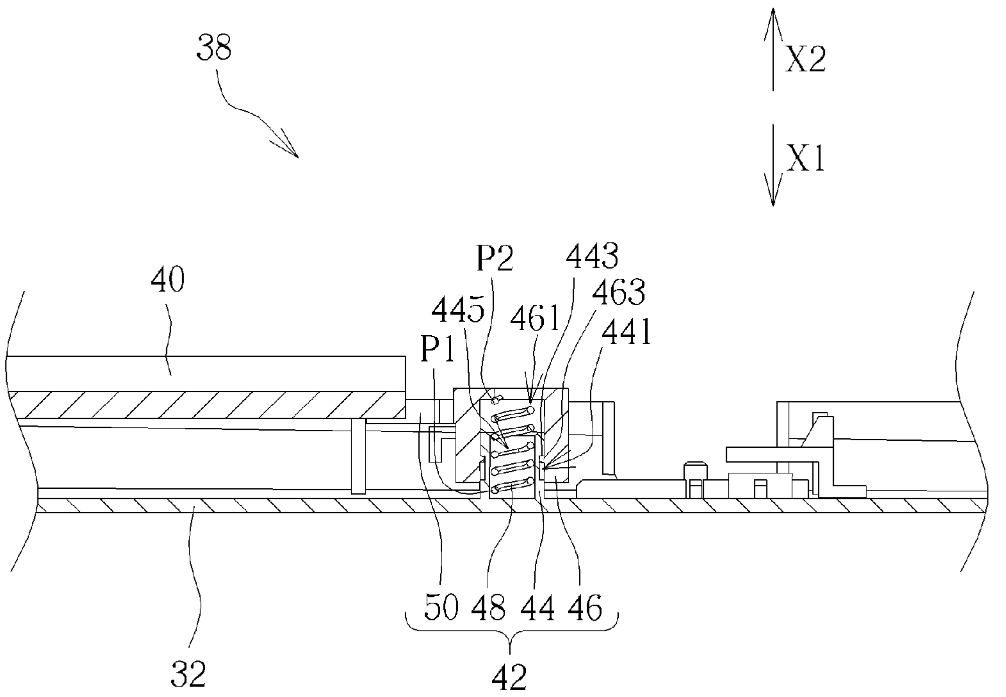
FIG. 4 is a partly sectional diagram of the first casing and the speaker device according to the embodiment of the present disclosure.

Please refer to FIG. 3 and FIG. 4. FIG. 4 is a partly sectional diagram of the first casing 32 and the speaker device 38 according to the embodiment of the present disclosure. As shown in FIG. 3 and FIG. 4, the damping mechanism 42 of the speaker device 38 includes a sheathing member 44 and a sleeve member 46. The sheathing member 44 is disposed on the first casing 32 and located in a position near the main body 40. The sleeve member 46 is connected to the main body 40 and sheathes the sheathing member 44 in a slidable manner. By connection of the sleeve member 46 and the main body 40, the sleeve member 46 is capable of transmitting the vibration resulting from the main body 40 as generating sound.

In addition, the damping mechanism 42 further includes a resilient member 48 with a first end P1 and a second end P2 respectively installed inside the sheathing member 44 and inside the sleeve member 46. The resilient member 48 is used for resiliently abutting against the sleeve member 46. Thus, the resilient member 48 can utilize elasticity thereof to absorb the vibration resulting from the sound generated by the main body 40 of the speaker device 38, so as to reduce noise resulting from the main body 40 as generating the sound. In other words, when the main body 40 generates the sound, the vibration resulting from the sound can be transmitted to the resilient member 48 via the sleeve member 46. Furthermore, since the resilient member 48 is capable of elastically damping the vibration resulting from the sound, the resilient member 48 is used for damping the vibration resulting from the sound, so as to reduce the vibration that results from the sound and rebounds back to the main body 40. In such a manner, the damping mechanism 42 of the present disclosure can reduce the noise resulting from the sound generated by the main body 40.

In this embodiment, the resilient member 48 is a spring. Practically, the spring advantages in low costs, and thus it can facilitate to decrease the costs in manufacture. Additionally, the spring does not easily deteriorate due to environmental effect, such as organic pollutants, oxidization and so on, so as to preserve its elasticity. In other words, the spring has a better tolerance to make the vibration absorbing structure preserve better vibration absorbing effect, such that the speaker device 38 can reduce noise more effectively and thus enhance product quality.

In addition, the damping mechanism 42 can further include a resilient arm 50 resiliently connected to the sleeve member 46 and the main body 40. The resilient arm 50 is capable of transmitting the vibration resulting from the main body 40 as generating the sound to the sleeve member 46. Furthermore, the resilient arm 50 is a resilient structure, such as a resilient arm structure, and the resilient arm 50 can be used elasticity thereof to absorb the vibration resulting from the main body 40 as generating the sound. Accordingly, when the main body 40 generates the sound, part of the vibration resulting from the sound can be absorbed by the resilient arm 50 before it is transmitted to the resilient member 48. In other words, the resilient arm 50 can assist the resilient member 48 to reduce the noise resulting from the main body 40 as generating the sound.

It should be noticed that the resilient arm 50 can be omitted, i.e. the sleeve member 46 of the damping mechanism 42 can be connected to the main body 40 without the resilient arm 50. As for which one of the aforesaid designs is adopted, it depends on practical demands. In this embodiment, the damping mechanism 42 includes two resilient arms 50 respectively connected to two sides of the sleeve member 46 and the main body 40. An amount and disposal positions of the resilient arm 50 of the present disclosure are not limited to those illustrated in figures, and it depends on practical demands.

Figure 5:
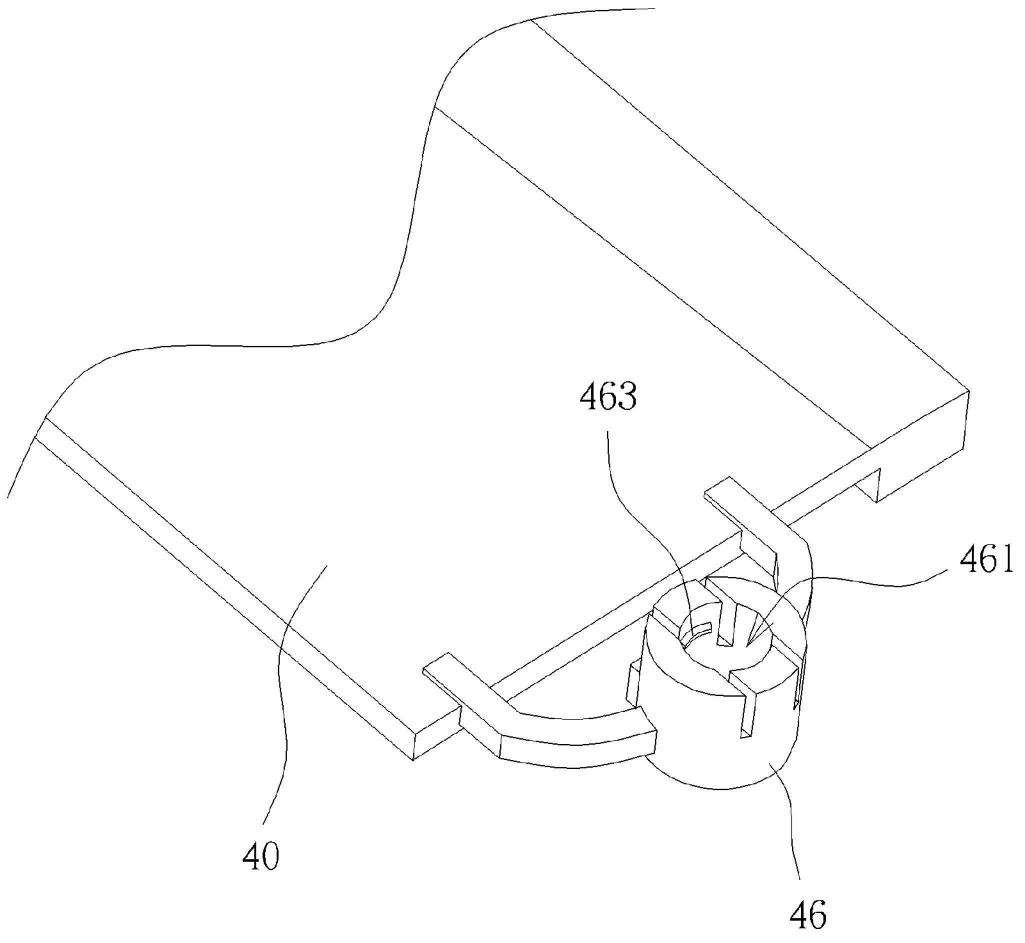
FIG. 5 is a diagram of a sleeve member and a main body in another view according to the embodiment of the present disclosure.

Please refer to FIG. 3 to FIG. 5. FIG. 5 is a diagram of the sleeve member 46 and the main body 40 in another view according to the embodiment of the present disclosure. As shown in FIG. 3 to FIG. 5, the sleeve member 46 includes a sheathing portion 461 for sheathing the second end P2 of the resilient member 48. In addition, the sheathing portion 461 of the sleeve member 46 is further used for slidably sheathing an outer surface of the sheathing member 44. Accordingly, the sleeve member 46 can slide relative to the sheathing member 44 in a first direction X1 or in a second direction X2 opposite to the first direction X1, as shown in FIG. 4, such that the speaker device 38 can slide relative to the first casing 32 in the first direction X1 or in the second direction X2, as shown in FIG. 4.

Furthermore, the sheathing member 44 includes a first stopping structure 441, and the sleeve member 46 includes a second stopping structure 463. The first stopping structure 441 is used for stopping the second stopping structure 463, so as to prevent the sleeve member 46 from separating from the sheathing member 44 in the second direction X2. In this embodiment, the first stopping structure 441 is a slot structure, and the second stopping structure 463 is a hook structure slidably disposed inside the slot structure, i.e. the first stopping structure 441. When the sleeve member 46 slides to a hooking position relative to the sheathing member 44 in the second direction X2, as shown in FIG. 4, the hook structure, i.e. the second stopping structure 463, is used for hooking a lateral wall 443 of the slot structure, i.e. the first stopping structure 441, so as to constrain the sleeve member 46 in the hooking position. In such a manner, the present disclosure can prevent the sleeve member 46 from separating from the sheathing member 44 and further constrain the speaker device 38 on the first casing 32.

The structures of the first stopping structure 441 and the second stopping structure 463 of the present disclosure are not limited to those mentioned in this embodiment. For example, the first stopping structure 441 and the second stopping structure 463 can be a stopping rib respectively protruding from the outer surface of the sheathing member 44 and an inner surface of the sleeve member 46. When the sleeve member 46 slides to the hooking position relative to the sheathing member 44, the first stopping structure 441 and the second stopping structure 463 can stop each other, so as to constrain the sleeve member 46 in the hooking position and further to prevent the sleeve member 46 from separating from the sheathing member 44. Accordingly, the speaker device 38 can be constrained on the first casing 32. In other words, structures of the first stopping structure 441 and the second stopping structure 463 capable of preventing the sleeve member 46 from separating from the sheathing member 44 are within the scope of the present disclosure.

As shown in FIG. 3 and FIG. 4, the a containing portion 445 is formed on the sheathing member 44 for containing the first end P1 of the resilient member 48. In this embodiment, the containing portion 445 is a sunken slot. When the speaker device 38 is installed on the first casing 32, the first end P1 of the resilient member 48 is contained inside the containing portion 445 first to make the first end P1 of the resilient member 48 abut against the a bottom surface of the containing portion 445. Then, the sheathing portion 461 of the sleeve member 46 sheathes the outer surface of the sheathing member 44, and the second stopping structure 463, i.e. the hook structure, is slid relative to the sheathing member 44 in the first direction X1, until the second stopping structure 463 is slidably disposed inside the first stopping structure 441, i.e. the slot structure. In the meantime, the second end P2 of the resilient member 48 can abut against the sleeve member 46. Accordingly, the vibration resulting from the sound generated by the main body 40 of the speaker device 38 can be transmitted to the resilient member 48 by the sleeve member 46, such that the resilient member 48 can elastically absorb the vibration, so as to reduce the noise resulting from the main body 40 as generating the sound.

As shown in FIG. 2 and FIG. 3, the speaker device 38 can further include a fixing structure 52 connected to a side of the main body 40 opposite to the damping mechanism 42. The fixing structure 52 is used for fixing the side of the main body 40 on the first casing 32. Additionally, the speaker device 38 can further include an elastic arm 54 connected to the fixing structure 52 and the side of the main body 40. Since the elastic arm 54 is a resilient structure, such as a resilient arm structure, the elastic arm 54 can elastically absorb the vibration resulting from sound generated by the main body 40. When the main body 40 generates the sound, part of the vibration resulting from the sound can be absorbed by the elastic arm 54 before it is transmitted to the fixing structure 52, so as to reduce the noise which results from the sound and rebounds back to the main body 40. Accordingly, the elastic arm 54 can reduce the noise resulting from the main body 40 as generating the sound. In this embodiment, the speaker device 38 includes two elastic arms 54 respectively connected to two sides of the fixing structure 52 and the main body 40. An amount and disposal positions of the elastic arm 54 are not limited to those illustrated in figures, and it depends on practical demands.

In this embodiment, the damping mechanism 42 is disposed on a side of the speaker device 38 of the present disclosure, and the fixing structure 52 is disposed on another side of the speaker device 38, i.e. the damping mechanism 42 is disposed on one single side of the speaker device 38, and the other side of the speaker device 38 is fixed by the fixing structure 52. Disposal positions of the speaker device 38 of the present disclosure are not limited to those mentioned in this embodiment. For example, the damping mechanism 42 can be disposed on both sides of the speaker device of the present disclosure, i.e. the fixing structure 52 of the speaker device can be omitted and adopts a design that the damping mechanism 42 is disposed on both sides of the speaker device. As for which one of the aforesaid designs is adopted, it depends on practical demands.

Figure 6:
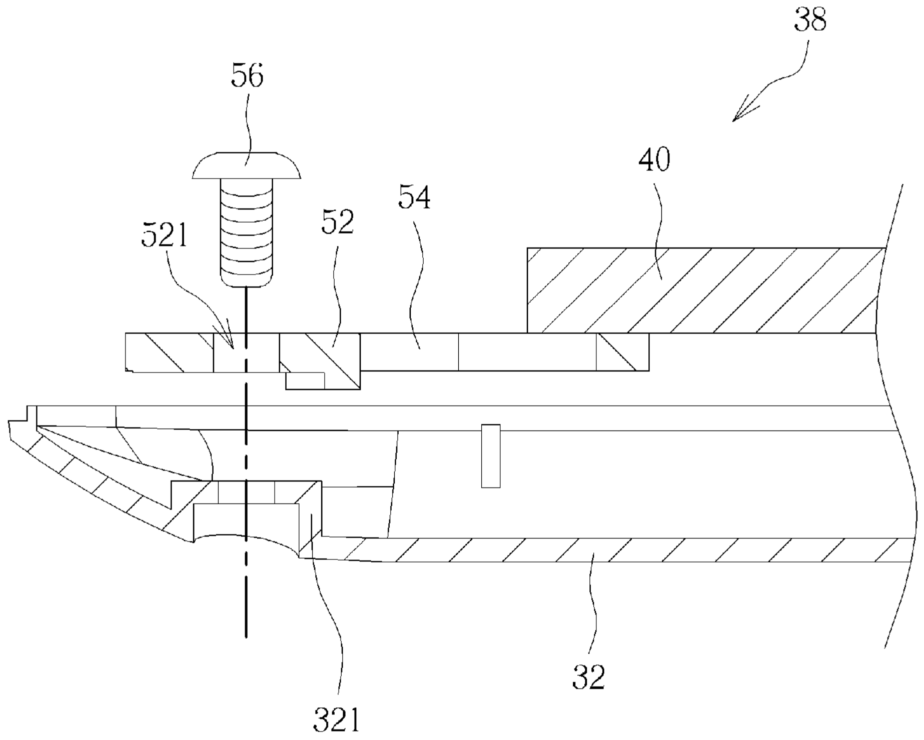
FIG. 6 is a partly exploded diagram of the first casing and a fixing structure according to the embodiment of the present disclosure.

Please refer to FIG. 3 and FIG. 6. FIG. 6 is a partly exploded diagram of the first casing 32 and the fixing structure 52 according to the embodiment of the present disclosure. As shown in FIG. 3 and FIG. 6, the first casing 32 includes a screw post structure 321, and a through hole 521 is formed on the fixing structure 52. The speaker device 38 further includes a screw component 56. When the side of the main body 40 of the speaker device 38 is installed on the first casing 32, the screw component 56 is disposed through the through hole 521 on the fixing structure 52. Then, the screw component 56 is screwed on the screw post structure 321 of the first casing 32. Accordingly, the screw component 56 can press the fixing structure 52 onto the screw post structure 321. In such a manner, the side of the main body 40 can be fixed on the first casing 32 by the screw component 56.

Figure 7:
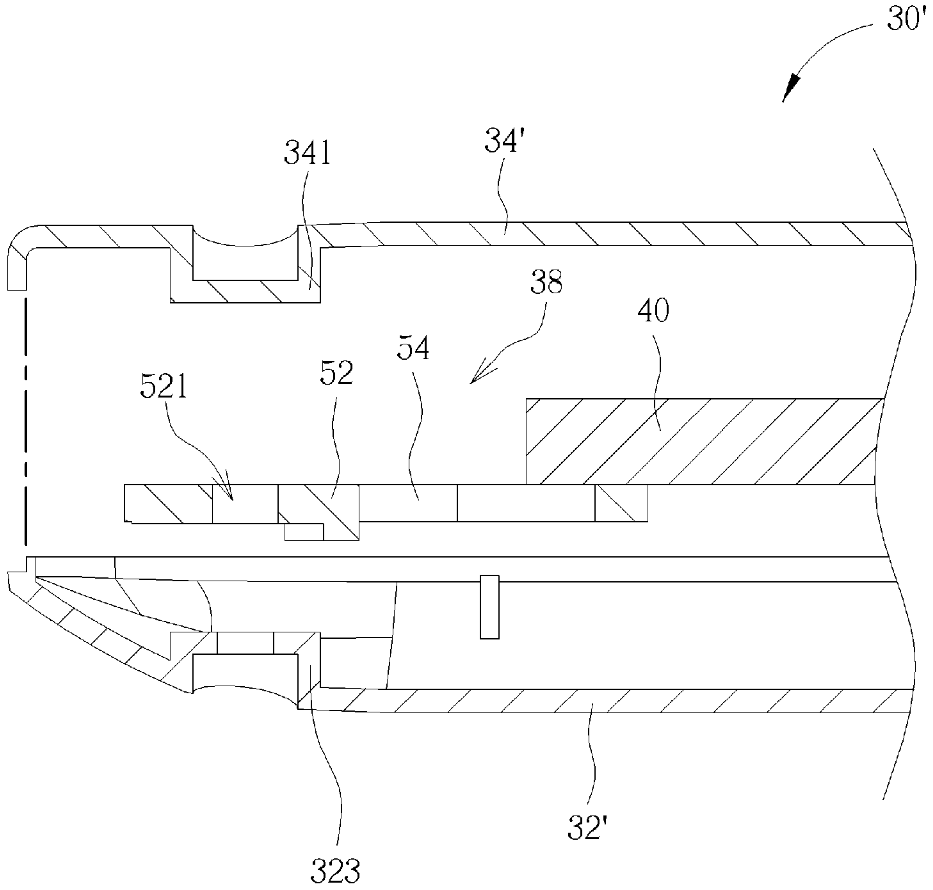
FIG. 7 is a partly exploded diagram of an audio display device according to another embodiment of the present disclosure.

Please refer to FIG. 7. FIG. 7 is a partly exploded diagram of an audio display device 30' according to another embodiment of the present disclosure. As shown in FIG. 7, the main difference between the audio display device 30' and the aforesaid audio display device 30 is that a first casing 32' of the audio display device 30' includes a first clamping structure 323, and a second casing 34' of the audio display device 30' includes a second clamping structure 341. When the side of the main body 40 of the speaker device 38 is installed on the first casing 32', the fixing structure 52 is disposed on the first clamping structure 323 of the first casing 32'. Then, the second casing 34' of the audio display device 30' is installed on the first casing 32'. In the meantime, the second clamping structure 341 of the second casing 34' can press the fixing structure 52 onto the first clamping structure 323. In such a manner, the side of the main body 40 can be fixed on the second casing 34' by the first clamping structure 323 and the second clamping structure 341. The components with denotes in this embodiment identical to those in the aforesaid embodiment have the same structures and functions, and further description is omitted herein for simplicity.

Compared to the prior art, the speaker device of the present disclosure utilizes the damping mechanism for absorbing vibration. When the main body generates the sound, the resilient member damps the vibration generated from the sound by flexibility thereof, so as to reduce the vibration generated from the sound to rebound back to the main body. In such a manner, the damping mechanism of the present disclosure can reduce noise resulted from the sound generated from the main body.

In practical application, the resilient member, such as a spring, advantages in low costs, and thus it can facilitate to decrease the costs in manufacture. In addition, the spring does not easily deteriorate due to environmental effect, such as organic pollutants, oxidization and so on, so as to preserve it elasticity. In other words, it has a better tolerance for the spring to make the vibration absorbing structure achieve better vibration absorbing effect, such that the speaker device can reduce noise more effectively and thus enhance product quality.

In addition, the speaker device of the present disclosure utilize the first stopping structure and the second stopping structure to prevent the sleeve member from separating from the sheathing member, so as to fix the speaker device on the first casing. During assembly, the sleeve member sheathes the sheathing member until the second stopping structure, i.e. the hook structure, is slidably disposed inside the first stopping structure, i.e. the slot structure. Accordingly, the present disclosure does not require additional screwing operation, resulting in saving labor hours and screwing components, such as screws. As a result, the speaker device of the present disclosure can further reduce the costs in manufacture.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A speaker device adapted to an audio display device, the audio display device comprising a first casing and a second casing, the speaker device comprising:

a main body installed inside the first casing and the second casing for generating sound; and at least one damping mechanism connected to the main body, the at least one damping mechanism comprising:

a sheathing member disposed on the first casing and located in a position near the main body;

a sleeve member connected to the main body and sheathing the sheathing member in a slidable manner, the sleeve member being for transmitting vibration generated by the main body as generating sound;

a resilient member with two ends respectively installed inside the sheathing member and inside the sleeve member, the resilient member being for resiliently abutting against the sleeve member, so as to absorb the vibration transmitted from the sleeve member as the main body generates the sound; and a resilient arm resiliently connected to the sleeve member and the main body, the resilient arm being for transmitting the vibration generated by the main body to the sleeve member.

2. The speaker device of claim 1, wherein the sleeve member comprises a sheathing portion for sheathing the end of the resilient member, and the sheathing portion is further for slidably sheathing an outer surface of the sheathing member, such that the sleeve member slides relative to the sheathing member in a first direction or in a second direction opposite to the first direction.

3. The speaker device of claim 2, wherein the sheathing member comprises a first stopping structure, the sleeve member comprises a second stopping structure, and the first stopping structure is for stopping the second stopping structure, so as to prevent the sleeve member from separating from the sheathing member in the second direction.

4. The speaker device of claim 3, wherein the first stopping structure is a slot structure, the second stopping structure is a hook structure slidably disposed inside the slot structure, and the hook structure is for hooking a lateral wall of the slot structure when the sleeve member slides to a hooking position relative to the sheathing member in the second direction, so as to prevent the sleeve member from separating from the sheathing member.

5. The speaker device of claim 3, wherein a containing portion is formed on the sheathing member, and the containing portion is a sunken slot for containing the other end of the resilient member.

6. The speaker device of claim 1, further comprising:
- a fixing structure connected to a side of the main body, the fixing structure being for fixing the side of the main body on the first casing.

7. The speaker device of claim 6, further comprising:
- an elastic arm resiliently connected to the fixing structure and the side of the main body, the resilient arm being for transmitting the vibration generated by the main body.

8. The speaker device of claim 6, wherein the first casing comprises a first clamping structure, the second casing comprises a second clamping structure, and the second clamping structure presses the fixing structure onto the first clamping structure when the second casing is installed on the first casing, so as to fix the side of the main body on the first casing.

9. The speaker device of claim 6, wherein the first casing comprises a screw post structure, a through hole is formed on the fixing structure, and the speaker device further comprises:
- a screw component for being disposed through the through hole and screwed with the screw post structure, so as to press the fixing structure onto the screw post structure.

10. The speaker device of claim 1, wherein the resilient member is a spring.

11. An audio display device, comprising:
- a first casing;
- a second casing installed on the first casing; and
- a speaker device, comprising:
  - a main body installed inside the first casing and the second casing for generating sound; and
  - at least one damping mechanism connected to the main body, the at least one damping mechanism comprising:
    - a sheathing member disposed on the first casing and located in a position near the main body;
    - a sleeve member connected to the main body and sheathing the sheathing member in a slidable manner, the sleeve member being for transmitting vibration generated by the main body as generating sound;
    - a resilient member with two ends respectively installed inside the sheathing member and inside the sleeve member, the resilient member being for resiliently abutting against the sleeve member, so as to absorb the vibration transmitted from the sleeve member as the main body generates the sound; and
    - a resilient arm resiliently connected to the sleeve member and the main body, the resilient arm being for transmitting the vibration generated by the main body to the sleeve member.

12. The audio display device of claim 11, wherein the sleeve member comprises a sheathing portion for sheathing the end of the resilient member, and the sheathing portion is further for slidably sheathing an outer surface of the sheathing member, such that the sleeve member slides relative to the sheathing member in a first direction or in a second direction opposite to the first direction.

13. The audio display device of claim 12, wherein the sheathing member comprises a first stopping structure, the sleeve member comprises a second stopping structure, and the first stopping structure is for stopping the second stopping structure, so as to prevent the sleeve member from separating from the sheathing member in the second direction.

14. The audio display device of claim 13, wherein the first stopping structure is a slot structure, the second stopping structure is a hook structure slidably disposed inside the slot structure, and the hook structure is for hooking a lateral wall of the slot structure when the sleeve member slides to a hooking position relative to the sheathing member in the second direction, so as to prevent the sleeve member from separating from the sheathing member.

15. The audio display device of claim 11, wherein the speaker device further comprises:
- a fixing structure connected to a side of the main body, the fixing structure being for fixing the side of the main body on the first casing.

16. The audio display device of claim 15, wherein the first casing comprises a first clamping structure, the second casing comprises a second clamping structure, and the second clamping structure presses the fixing structure onto the first clamping structure when the second casing is installed on the first casing, so as to fix the side of the main body on the first casing.

17. The audio display device of claim 15, wherein the first casing comprises a screw post structure, a through hole is formed on the fixing structure, and the speaker device further comprises:
- a screw component for being disposed through the through hole and screwed with the screw post structure, so as to press the fixing structure onto the screw post structure.

* * * * *